(12) United States Patent
Young et al.

(10) Patent No.: US 11,855,205 B2
(45) Date of Patent: *Dec. 26, 2023

(54) SEMICONDUCTOR DEVICE WITH NEGATIVE CAPACITANCE STRUCTURE

(71) Applicant: Taiwan Semiconductor Manufacturing Company, Ltd., Hsinchu (TW)

(72) Inventors: Bo-Feng Young, Taipei (TW); Chih-Yu Chang, New Taipei (TW); Sai-Hooi Yeong, Zhubei (TW); Chi-On Chui, Hsinchu (TW); Chih-Hao Wang, Baoshan Township, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/874,008

(22) Filed: Jul. 26, 2022

(65) Prior Publication Data

US 2022/0367724 A1  Nov. 17, 2022

Related U.S. Application Data

(60) Continuation of application No. 17/113,533, filed on Dec. 7, 2020, now Pat. No. 11,469,324, which is a
(Continued)

(51) Int. Cl.
*H01L 29/51* (2006.01)
*H01L 29/78* (2006.01)
*H01L 29/08* (2006.01)
*H01L 29/417* (2006.01)
*H01L 29/24* (2006.01)
(Continued)

(52) U.S. Cl.
CPC .... *H01L 29/78391* (2014.09); *H01L 29/0847* (2013.01); *H01L 29/24* (2013.01); *H01L 29/41783* (2013.01); *H01L 29/513* (2013.01); *H01L 29/516* (2013.01); *H01L 29/6684* (2013.01); *H01L 29/66545* (2013.01); *H01L 29/66795* (2013.01); *H01L 29/7851* (2013.01); *H01L 21/467* (2013.01); *H01L 29/401* (2013.01); *H01L 29/517* (2013.01)

(58) Field of Classification Search
None
See application file for complete search history.

(56) References Cited

U.S. PATENT DOCUMENTS 11,469,324 B2 * 10/2022 Young ............... H01L 29/66545
2016/0336312 A1 11/2016 Yan et al.
(Continued)

*Primary Examiner* — Benjamin P Sandvik
(74) *Attorney, Agent, or Firm* — Birch, Stewart, Kolasch & Birch, LLP

(57) ABSTRACT

A semiconductor device structure is provided. The semiconductor device structure includes a substrate having a fin structure that includes a first negative capacitance material, and an isolation structure formed over the substrate. The semiconductor device structure includes a gate structure formed over the fin structure, and a source feature and a drain feature formed over the fin structure. An interface between the fin structure and the source feature is lower than a top surface of the isolation structure.

20 Claims, 13 Drawing Sheets

Related U.S. Application Data division of application No. 16/427,078, filed on May 30, 2019, now Pat. No. 10,861,968.

(51) Int. Cl.
*H01L 29/66* (2006.01)
*H01L 29/40* (2006.01)
*H01L 21/467* (2006.01)

(56) References Cited

U.S. PATENT DOCUMENTS

| | | |
|---|---|---|
| 2019/0237464 A1 | 8/2019 | Ching et al. |
| 2020/0105898 A1 | 4/2020 | Hsu et al. |
| 2020/0176585 A1 | 6/2020 | Young et al. |

* cited by examiner

SEMICONDUCTOR DEVICE WITH NEGATIVE CAPACITANCE STRUCTURE

PRIORITY CLAIM AND CROSS-REFERENCE

This is a Continuation application of U.S. patent application Ser. No. 17/113,533, filed on Dec. 7, 2020, which is a divisional application of U.S. patent application Ser. No. 16/427,078, filed on May 30, 2019, which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted.

For example, as transistors (which are circuit elements in semiconductor devices), such as filed effect transistors (FET), continuing downscaling, power dissipation has become more important for nanoelectronic circuits. If transistors could be operated at lower voltages, the power dissipation would be lowered for power saving. This can be achieved by incorporating the negative capacitance (NC) effect of ferroelectric materials to the gate stack of the transistor. This combination is known as negative capacitance (NC) transistors. Negative capacitance (NC) transistors can have good device performance through well capacitance matching (between a ferroelectric capacitor and a dielectric capacitor that is in series with the ferroelectric capacitor). Typically, the thickness of the ferroelectric material in the ferroelectric capacitor or the dielectric material in the dielectric capacitor is adjusted for capacitance matching.

Although existing negative capacitance (NC) transistors and methods for fabricating those transistors have been generally adequate for their intended purposes, they have not been entirely satisfactory in all respects. For example, as the size of transistor structure has been reduced, problems may occur when the gate structure with small critical dimension (CD) is formed. Therefore, it is a challenge to form negative capacitance (NC) transistors with satisfactory performance at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
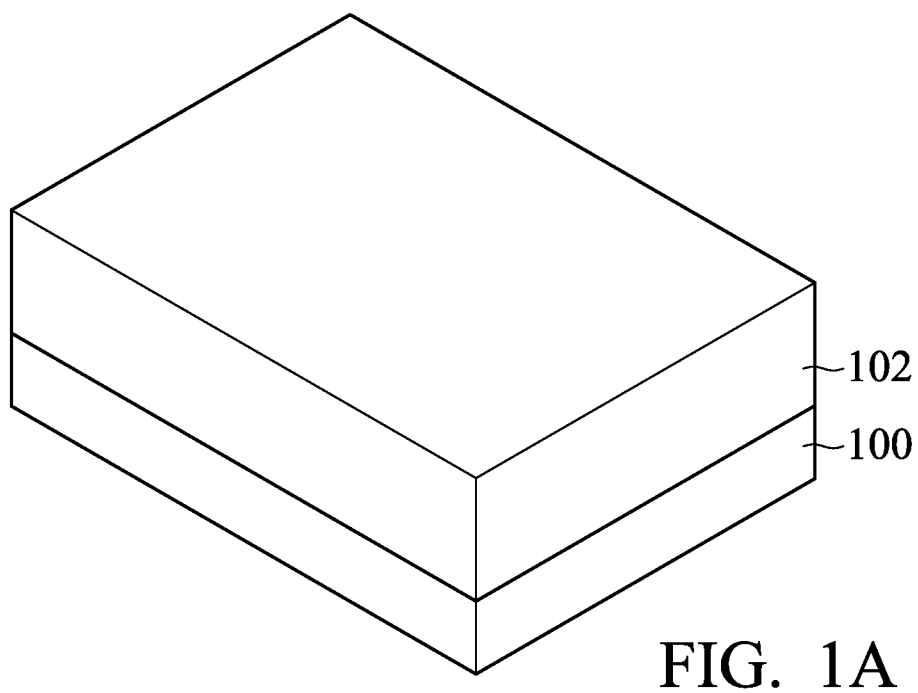
FIGS. 1A to 1N show perspective representations of various stages of forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments for manufacturing semiconductor device structures are provided. In some embodiments, the semiconductor device structure is implemented as a fin field effect transistor (FinFET) structure. The intermediate stages of forming the FinFET are illustrated. The variations of the embodiments are discussed. Throughout the various views and illustrative embodiments, like reference numbers are used to designate like elements.

Embodiments such as those described herein provide a negative capacitance (NC) FinFET structure with a negative capacitance gate stack and/or a negative capacitance channel. The semiconductor device structures may include a substrate having a fin structure that includes a negative capacitance semiconductor material. The formation of the fin structure may include forming a negative capacitance material over a substrate and patterning the negative capacitance material to form the fin structure over the substrate. Afterward, a gate dielectric structure and a gate electrode layer may be successively formed over the fin structure. The formation of the gate dielectric structure may include conformity forming a first layer in direct contact with a channel region of the fin structure and forming a second layer over the first layer. The second layer may be made a negative capacitance dielectric material or a high-k dielectric material. In some embodiments, the negative capacitance semiconductor material and the negative capacitance dielectric material are ferroelectric materials. In some other embodiments, the negative capacitance semiconductor material and the negative capacitance dielectric material are anti-ferroelectric materials.

The fin structure and the gate dielectric structure that include the negative capacitance material can provide the negative capacitance effect in the semiconductor device structure, so as to increase device performance. Moreover, the observed hysteresis direction of the negative capacitance semiconductor material in the channel region of the fin structure is opposite to the observed hysteresis direction of the negative capacitance dielectric material in the gate dielectric structure. Therefore, the hysteresis behavior in the negative capacitance FinFET structure can be mitigated or eliminated.

In addition, when the gate structures with small critical dimension (CD) are formed, the thickness of the fin structure can be adjusted or controlled for capacitance matching. Therefore, the adjustment or control of the thickness of the gate dielectric structure for capacitance matching becomes flexible. As a result, the gate-filling process window can be maintained or increased while improving the device's performance.

Figure 1B:
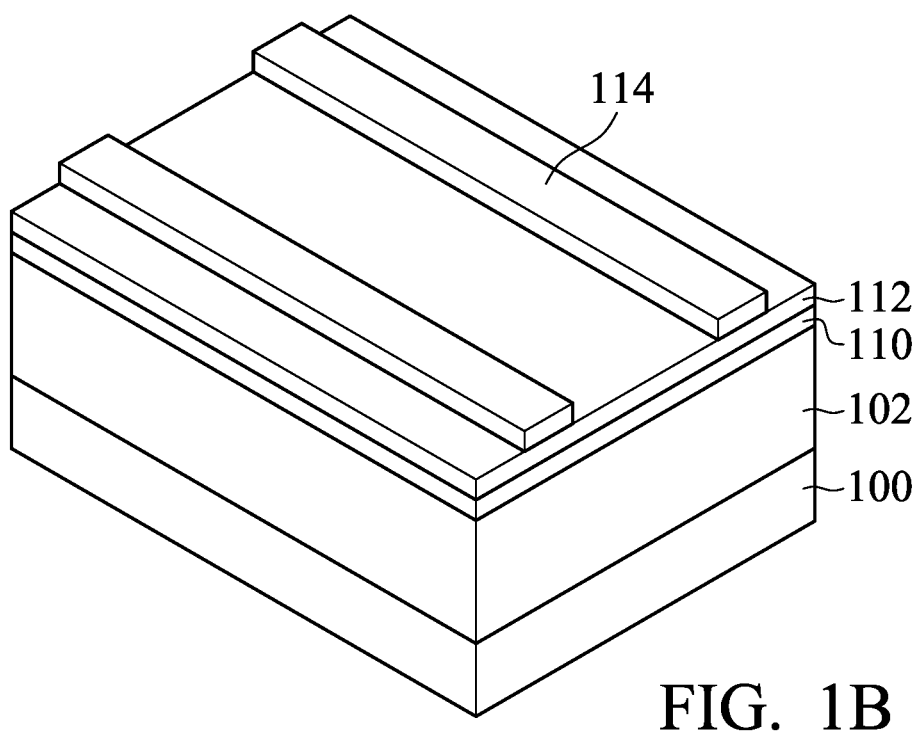
Figure 1C:
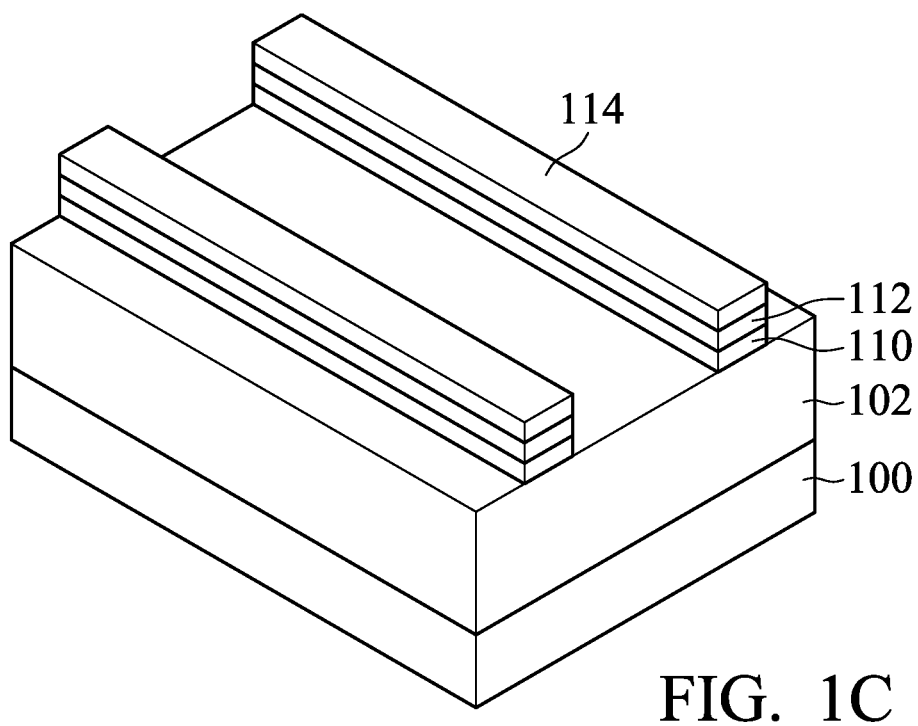
Figure 1D:
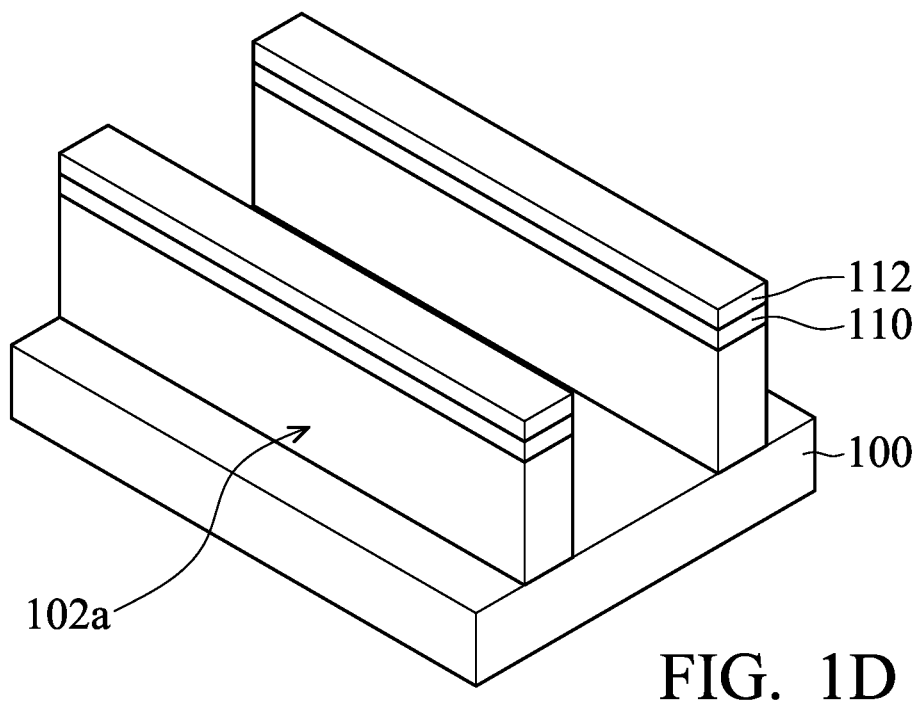
Figure 1E:
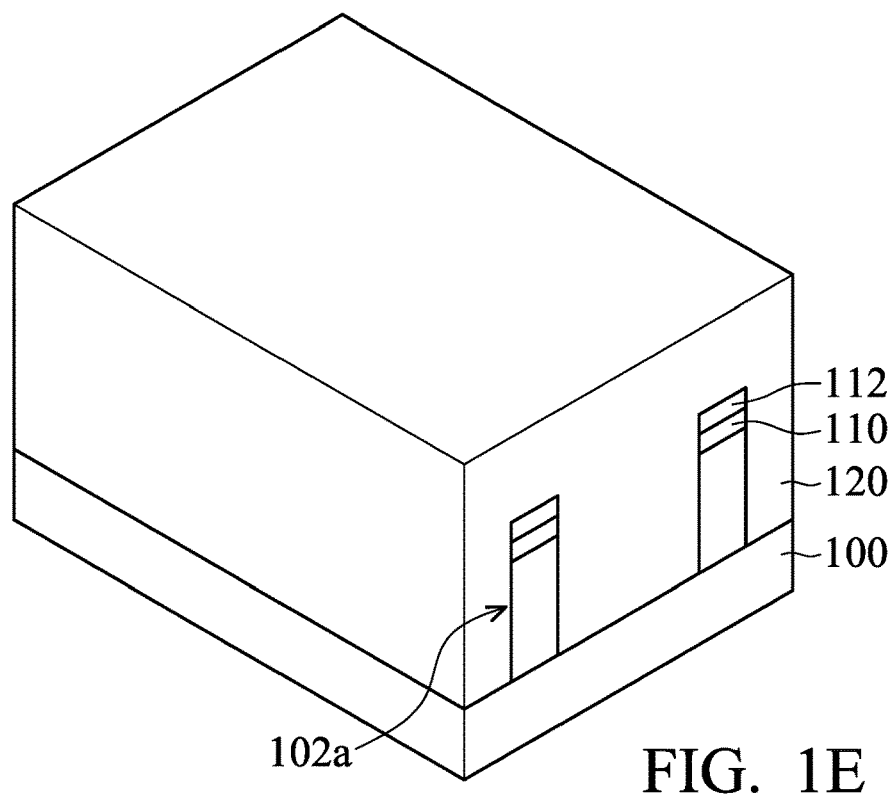
Figure 1F:
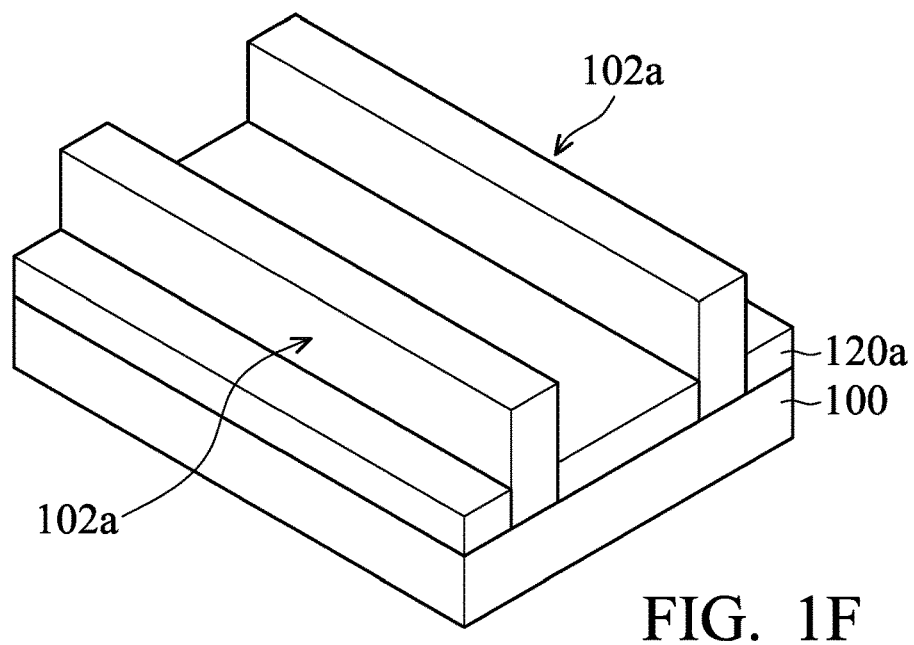
Figure 1G:
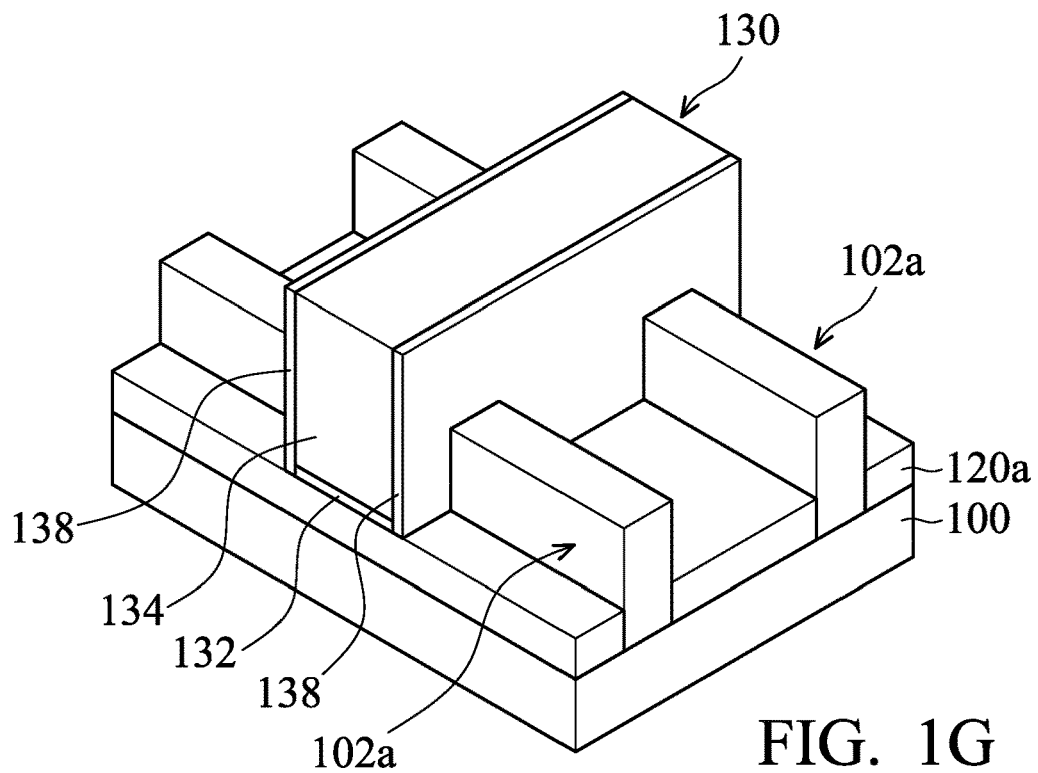
Figure 1H:
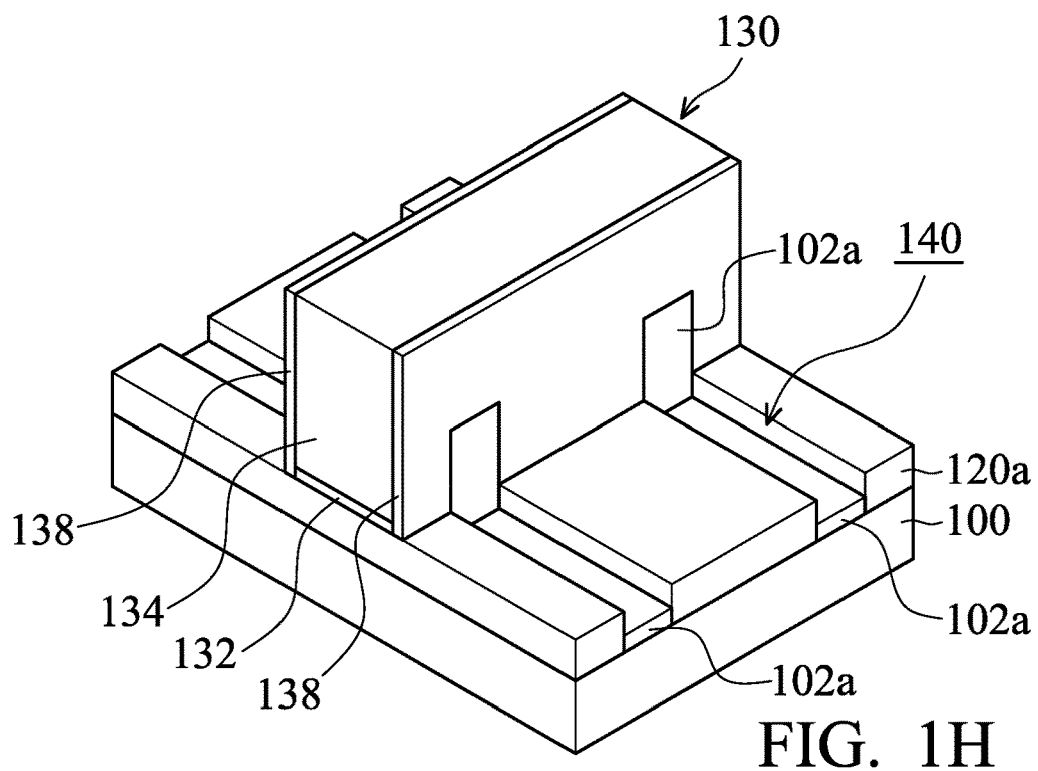
Figure 1I:
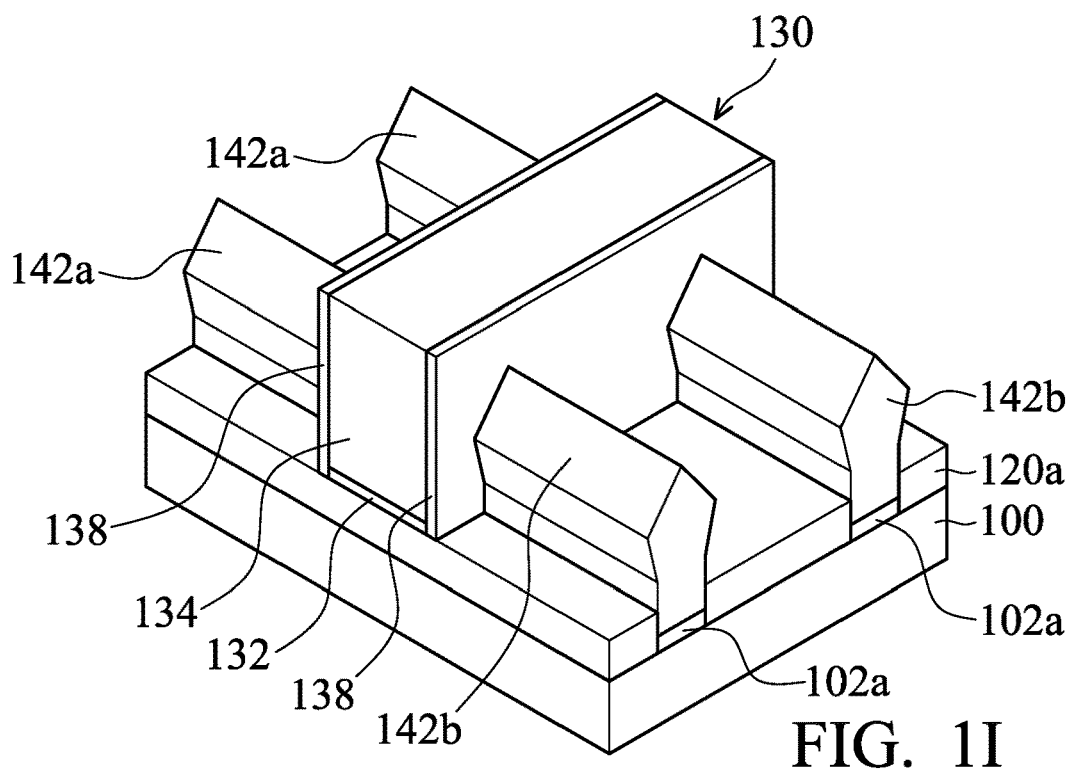
Figure 1J:
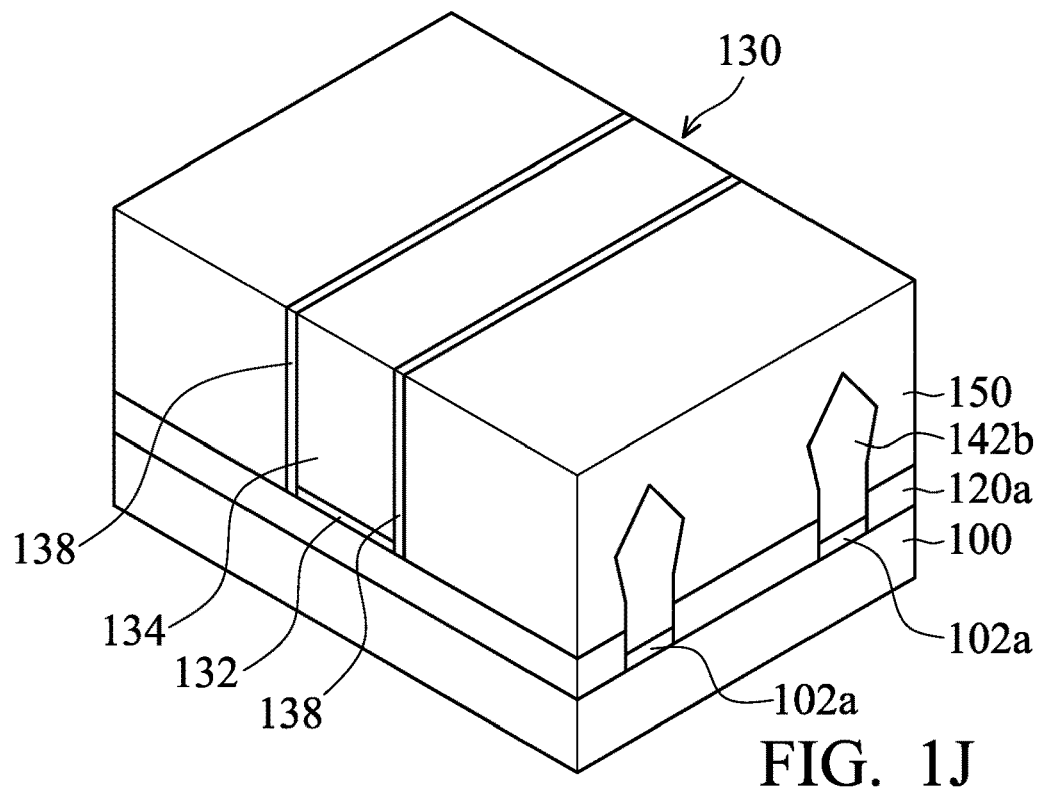
Figure 1K:
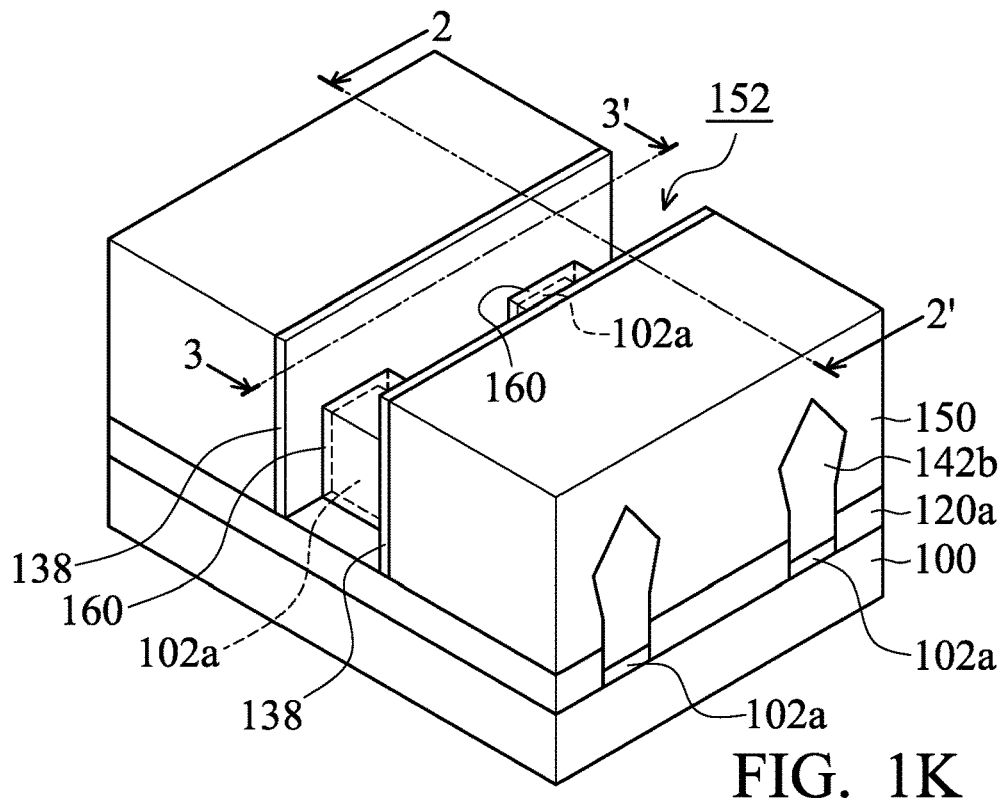
Figure 1L:
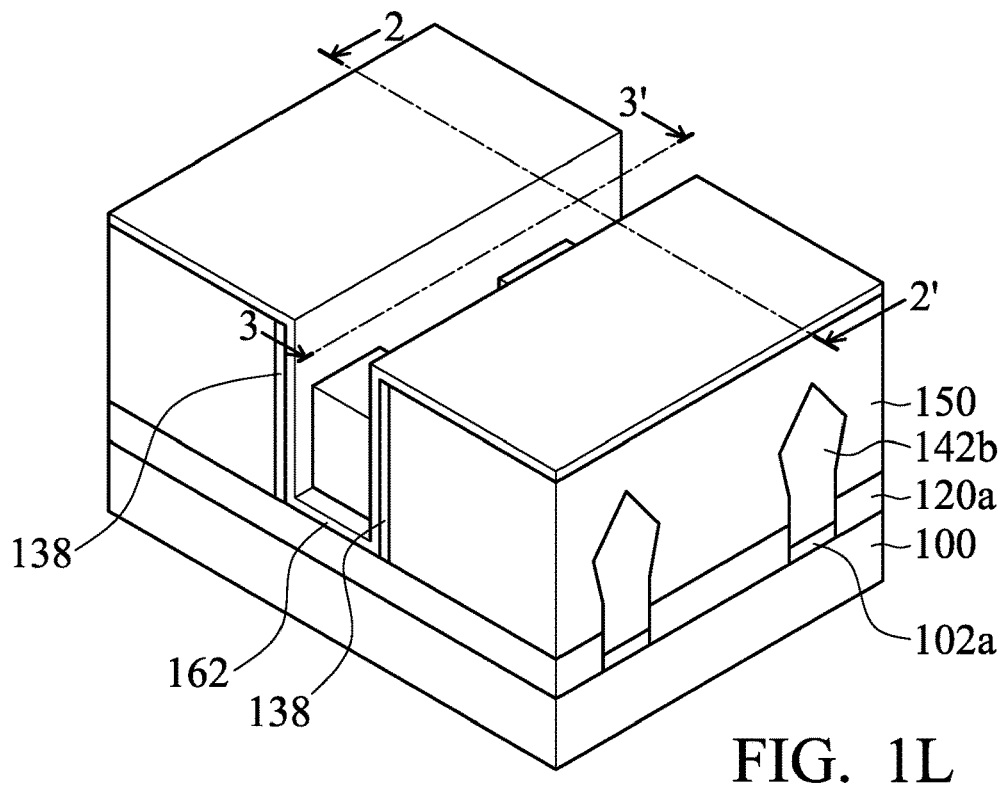
Figure 1M:
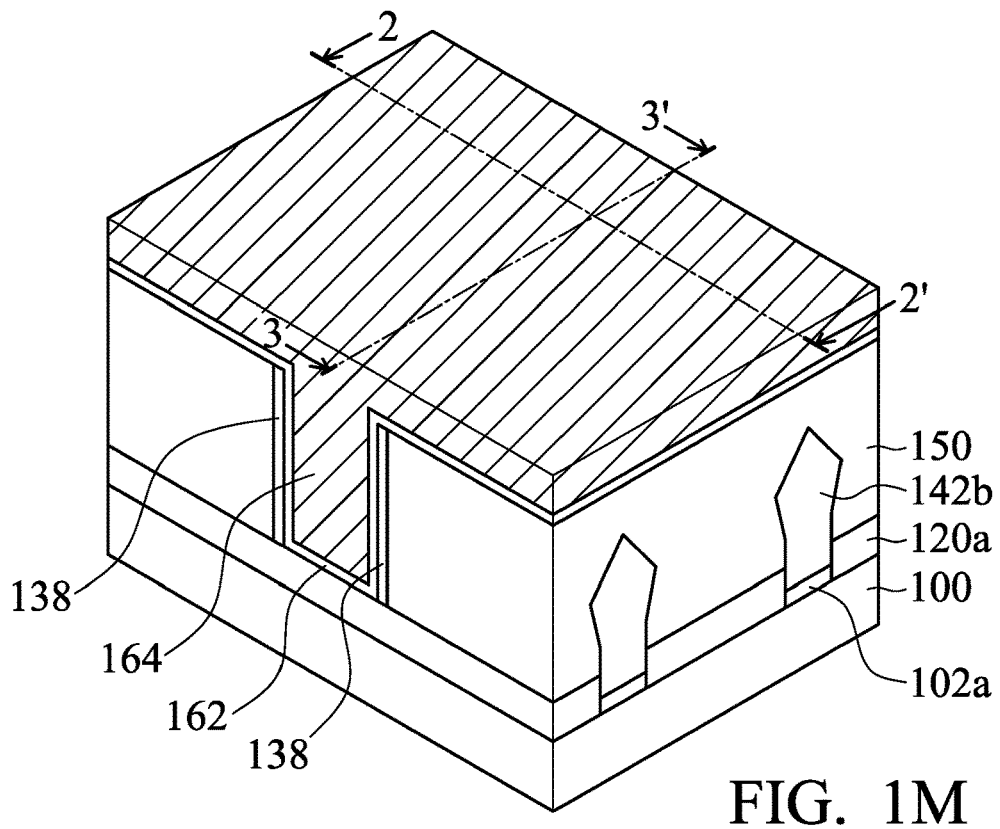
Figure 1N:
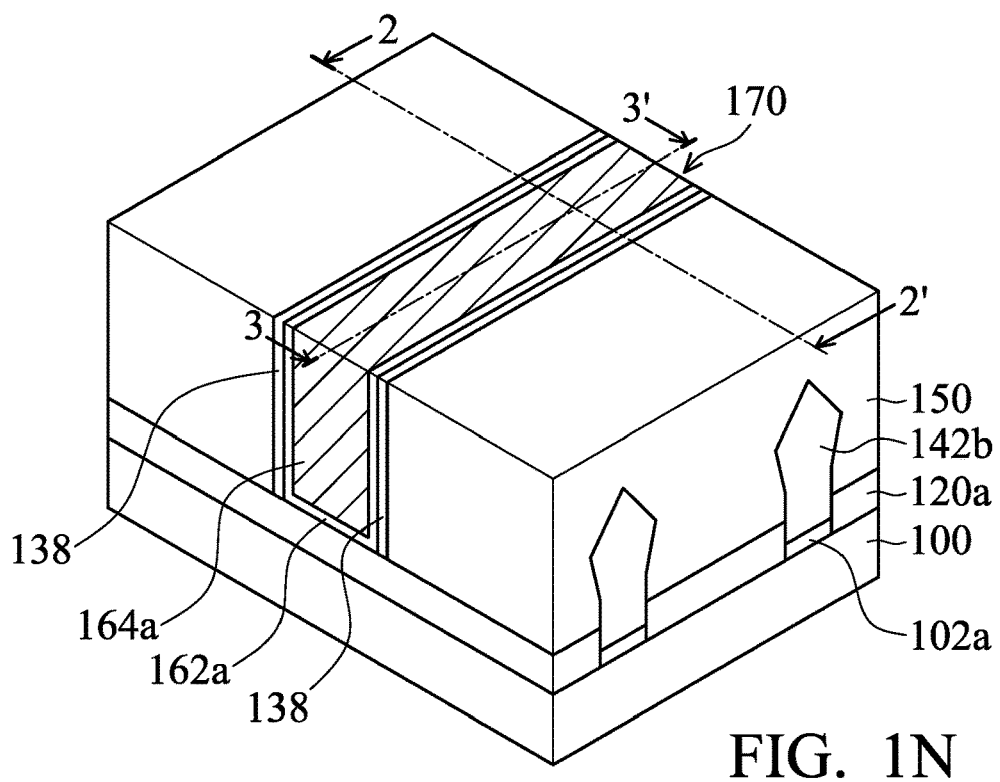

FIGS. 1A to 1N illustrate perspective views of various stages of manufacturing a semiconductor device structure in accordance with some embodiments. In addition, FIGS. 2A to 2D illustrate the cross-sectional representations of the semiconductor device structure shown along line 2-2' in FIGS. 1K to 1N, in accordance with some embodiments and FIGS. 3A to 3D illustrate the cross-sectional representations of the semiconductor device structure shown along line 3-3' in FIGS. 1K to 1N, in accordance with some embodiments.

As shown in FIG. 1A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the SOI substrate is fabricated using a wafer bonding process, a silicon film transfer process, a separation by implantation of oxygen (SIMOX) process, another applicable method, or a combination thereof. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

Afterwards, a negative capacitance material 102 is formed over the substrate in accordance with some embodiments. The negative capacitance material 102 is used for definition of fin structures, so that those fin structure have a channel region made of the negative capacitance material 102. The negative capacitance material 102 is a semiconductor material that has ferroelectric (FE) or anti-ferroelectric (AFE) properties. In some embodiments, the negative capacitance material 102 includes a ferroelectric semiconductor material, such as $In_2Se_3$, $CuInP_2S_6$, $Bi_2FeCrO_6$, $BiFeO_3$, SbSI, or the like. Alternatively, the negative capacitance material 102 includes an anti-ferroelectric semiconductor material, such as SrLiAs, LiBeP, $NaNbO_3$, $AgNbO_3$, or the like. The negative capacitance material 102 may be formed by a chemical vapor deposition (CVD) process, a physical vapor deposition (PVD) process, a sputtering process, or another applicable process.

After the negative capacitance material 102 is formed over the substrate 100, an insulating layer 110 and a masking layer 112 are successively formed over the negative capacitance material 102, as shown in FIG. 1B in accordance with some embodiments. In some embodiments, the insulating layer 110 serves as a buffer layer or an adhesion layer that is formed between the underlying substrate 100 and the overlying masking layer 112. In addition, the insulating layer 110 may be used as an etch stop layer when the masking layer 112 is removed or etched.

In some embodiments, the insulating layer 110 is made of silicon oxide. The insulating layer 110 may be formed by a deposition process, such as a chemical vapor deposition process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the masking layer 112 is made of silicon oxide, silicon nitride, silicon oxynitride, or another applicable material. In some other embodiments, more than one masking layer 112 is formed over the insulating layer 110. In some embodiments, the masking layer 112 is formed by a deposition process, such as a CVD process, a LPCVD process, a PECVD process, an HDPCVD process, a spin-on process, or another applicable process.

After formation of the insulating layer 110 and the masking layer 112, a patterned photoresist layer 114 photoresist layer 114 may be formed over the masking layer 112 for definition of one or more fin structures in the negative capacitance material 102. In some embodiments, the patterned photoresist layer 114 is formed by a photolithography process. For example, the photolithography process may include photoresist coating (e.g., spin-on coating), soft baking, mask aligning, exposure, post-exposure baking, developing the photoresist, rinsing and drying (e.g., hard baking).

Afterwards, the insulating layer 110 and the overlying masking layer 112 are patterned by using the patterned photoresist layer 114 as an etch mask, so as to from a patterned insulating layer 110 and a patterned masking layer 112, as shown in FIG. 1C in accordance with some embodiments. The patterned insulating layer 110 and the patterned masking layer 112 expose portions of the negative capacitance material 102.

After the portions of the negative capacitance material 102 are exposed from the patterned insulating layer 110 and the patterned masking layer 112, the patterned photoresist layer 114 is removed, in accordance with some embodiments. Afterwards, an etching process is performed on the negative capacitance material 102 to form fin structures and trenches in the substrate 100 by using the patterned insulating layer 110 and the patterned masking layer 112 as an etch mask, as shown in FIG. 1D in accordance with some embodiments. In order to simplify the diagram, two fin structures 102a that are formed by the negative capacitance material 102 are depicted as an example.

In some other embodiments, the etching process for formation of fin structures 102a is performed on the negative capacitance material 102 and the underlying substrate 100, so that each of the formed fin structures 102a are formed by a portion of the negative capacitance material 102 and a portion of the substrate 100.

In some embodiments, the etching process for formation of fin structures 102a is a dry etching process or a wet etching process. For an example, the negative capacitance material 102 is etched by a dry etching process, such as a reactive ion etching (RIE), neutral beam etching (NBE), the like, or a combination thereof. The etching process may be a time-controlled process, and continue until the fin structures 102a are formed and reach a predetermined height.

In some other embodiments, each of the fin structures 102a has a width that gradually increases from the top portion to the lower portion. Namely, each of the fin structures 102a may have tapered sidewalls. A person of ordinary skill in the art will readily understand other methods of forming the fin structures, which are contemplated within the scope of some embodiments.

After the etching process for formation of fin structures 102a, an insulating layer 120 is formed to cover the fin structures 102a over the substrate 100, as shown in FIG. 1E in accordance with some embodiments. In some embodiments, the insulating layer 120 is made of silicon oxide, fluoride-doped silicate glass (FSG), a low-k dielectric material, and/or another suitable dielectric material or another low-k dielectric material. The insulating layer 120 may be deposited in a CVD process, a flowable CVD (FCVD) process, a spin-on-glass process, or another applicable process.

In some other embodiments, a liner structure (not shown) is optionally formed on the sidewalls of the fin structures 102a and the bottom of the trenches between the fin structures 102a prior to formation of the insulating layer 120. In some embodiments, the liner structure may include a single layer or a multiple structure and may be made of silicon oxide, silicon nitride, silicon oxynitride, silicon carbide (SiC), or a combination thereof. The liner structure may be deposited in a CND process or another applicable process.

Afterwards, the insulating layer 120 is thinned or planarized to expose the top surface of the patterned masking layer 112, in accordance with some embodiments. For example, the insulating layer 120 is planarized by a chemical mechanical polishing (CMP) process. After the top surface of the patterned masking layer 112 is exposed, the patterned masking layer 112 and the patterned insulating layer 110 are successively removed by one or more etching processes, so as to expose the top surfaces of the fin structures 102a. In some embodiments, the patterned masking layer 112 and the patterned insulating layer 110 are removed by a dry etching process, a wet etching process, or a combination thereof.

After the removal of the patterned masking layer 112 and the patterned insulating layer 110, a portion of the insulating layer 120 is removed to form isolation features 120a, as shown in FIG. 1F in accordance with some embodiments. In some embodiments, the isolation feature 120a includes the remaining insulator layer 120 and the liner structure (if presented) surrounding the remaining insulator layer 120. The isolation features 120a may be shallow trench isolation (STI) structures surrounding the fin structures 102a. The lower portions of the fin structure 102a are embedded and surrounded by the isolation features 120a. The upper portions of the fin structure 102a protrude from the upper surface of the isolation features 120a.

After formation of the isolation features 120a, a dummy gate structure 130 is formed across the fin structures 102a and extends over the isolation features 120a, as shown in FIG. 1G in accordance with some embodiments. In some embodiments, the dummy gate structure 130 includes a dummy gate dielectric layer 132 and a dummy gate electrode layer 134.

The dummy gate dielectric layer 132 may be made of silicon oxide, silicon oxide nitride, or a high dielectric constant (high-k) dielectric material, or another applicable dielectric material. The high-k dielectric material having the dielectric constant higher than the dielectric constant of silicon oxide, about 3.9. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material. The dummy gate dielectric layer 132 may be formed using a CVD process, a physical vapor deposition (PVD) process, an atomic layer deposition (ALD) process, a molecular beam epitaxy (MBE) process, or another applicable process.

Afterwards, the dummy gate electrode layer 134 is formed over dummy gate dielectric layer 132. In some embodiments, the dummy gate electrode layer 134 is made of polysilicon. The dummy gate dielectric layer 132 and the dummy gate electrode layer 134 are patterned one or more etching processes, so as to form the dummy gate structure 130.

After the dummy gate structure 130 is formed, gate spacer layers 138 are formed on two opposite sidewall surfaces of the dummy gate structure 130, as shown in FIG. 1G in accordance with some embodiments. The gate spacer layers 138 may be a single layer or multiple layers. In some embodiments, the gate spacer layers 138 are made of silicon nitride, silicon oxide, silicon carbide, silicon oxynitride, or other applicable materials.

After the gate spacer layers 138 are formed, portions of the fin structures 102a are removed by etching, so that two recesses 140 are respectively formed in a source region (not shown) and a drain region (not shown) of each fin structure 102a and separated from each other by the dummy gate structure 130 and the gate spacer layers 138, as shown in FIG. 1H in accordance with some embodiments. In some embodiments, the recesses 140 have a bottom surface that is lower than the top surface of the isolation feature 120a and higher than the bottom surface of the isolation feature 120a. The fin structure 102a between the two recesses 140 and covered by the dummy gate structure 130 serves as a channel feature.

After the recesses 140 are formed, a source feature 142a and a drain feature 142b are respectively formed in the recesses 140 (not shown and as indicated in FIG. 1H) and protrudes from the top surface of the isolation features 120a and the source and drain regions of each fin structure 102a, as shown in FIG. 1I in accordance with some embodiments. In some embodiments, portions of each fin structure 102a adjacent to the dummy gate structure 130 are recessed to form recesses 140 and define a channel region of the fin structure 102a (i.e., which is also referred to a channel feature), and a strained material is grown in each recess 140 of the fin structure 102a by an epitaxial process to form the source feature 142a and the drain feature 142b. The source feature 142a and the drain feature 142b are formed over the fin structure 102a. In some embodiments, the source feature 142a and the drain feature 142b include Ge, SiGe, InAs, InGaAs, InSb, GaAs, GaSb, InAlP, InP, or the like.

After the source feature 142a and the drain feature 142b separated from each other by dummy gate structure 130 are formed, an dielectric layer 150 is formed over the substrate 100 to cover the dummy gate structure 130, the gate spacer layers 138, the fin structures 102a, the source features 142a, and the drain features 142b, in accordance with some embodiments. In some embodiments, the dielectric layer 150 (e.g., an inter-layer dielectric (ILD) layer) include multilayers that are made of multiple dielectric materials, such as silicon oxide, silicon nitride, silicon oxynitride, tetraethoxysilane. (TEOS), phosphosilicate glass (PSG), borophosphosilicate glass (BPSG), low-k dielectric material, and/or other applicable dielectric materials. Examples of low-k dielectric materials may include fluorosilicate glass (FSG), carbon doped silicon oxide, amorphous fluorinated carbon, parylene, bis-benzocyclobutenes (BCB), polyimide. The dielectric layer 150 may be formed using a CVD process, a PVD process, an ALD process, a spin-on coating process, or another applicable process.

In some embodiments, a contact etch stop layer (not shown) is formed over the substrate 100 prior to the formation of the dielectric layer 150. The contact etch stop layer may be made of silicon nitride, silicon oxynitride, and/or other applicable materials. The contact etch stop layer may be formed by a PECVD process, a LPCVD process, an atomic layer deposition process, or another applicable process.

After the dielectric layer 150 is formed, a planarization process is performed on the dielectric layer 150 until the top surface of the dummy gate structure 130 and the gate spacer layer 138 are exposed, as shown in FIG. 1J in accordance with some embodiments. In some embodiments, the dielectric layer 150 is planarized by a polishing process, such as a chemical mechanical polishing (CMP) process.

After the dielectric layer 150 is planarized, the exposed dummy gate structure 130 is removed from the structure shown in FIG. 1J, so as to form an opening 152 in the dielectric layer 150, as shown in FIG. 1K in accordance with some embodiments.

Figure 2A:
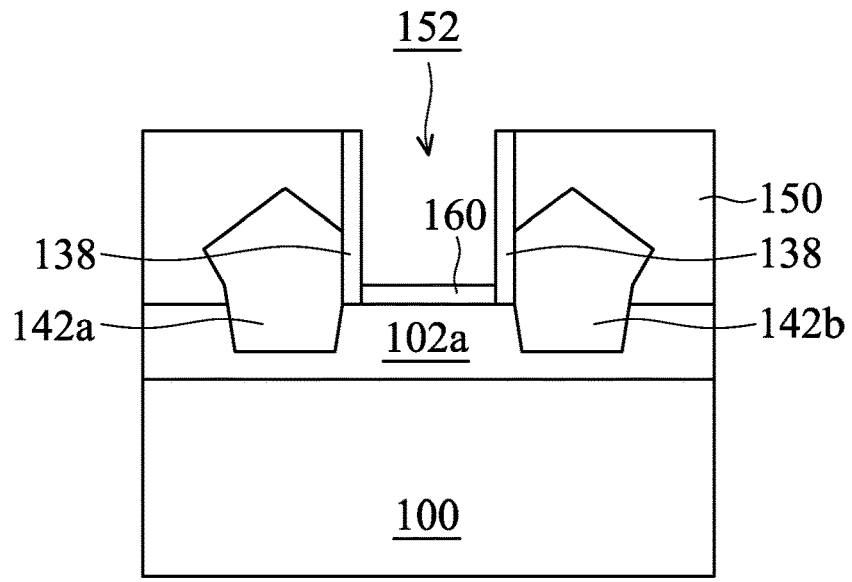
FIGS. 2A to 2D show cross-sectional representations of various stages of forming the semiconductor device structure taken along the line 2-2' in FIGS. 1K to 1N, in accordance with some embodiments.
Figure 3A:
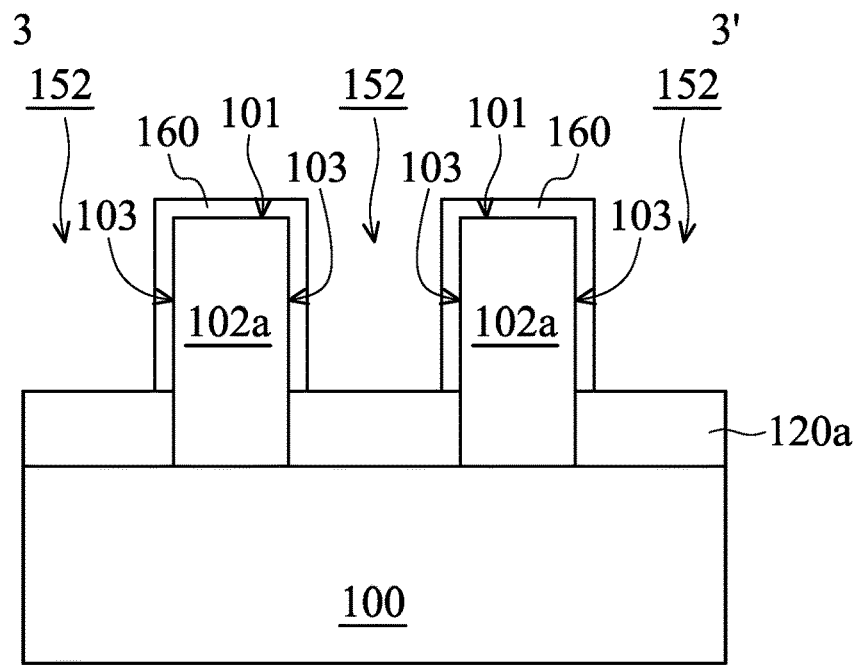
FIGS. 3A to 3D show cross-sectional representations of various stages of forming the semiconductor device structure taken along the line 3-3' in FIGS. 1K to 1N, in accordance with some embodiments.

FIGS. 2A and 3A respectively show cross-sectional representations of the semiconductor device structure taken along the line 2-2' and the line 3-3' in FIG. 1K. In some embodiments, the dummy gate dielectric layer 132 and the dummy gate electrode layer 134 are removed by an etching process, such as a dry etching process or a wet etching process.

The opening 152 is formed in the dielectric layer 150 by removing the dummy gate structure 130 shown in FIG. 1J to expose each channel feature (i.e., the fin structure 102a between the corresponding source feature 142a and the corresponding drain feature 142b), so that each source features 142a and the corresponding drain feature 142b are on opposing sidewall surfaces of the opening 152, as shown in FIG. 2A. In some embodiments, the opposing sidewall surfaces of the opening 152 are formed of the gate spacer layers 138.

Afterwards, a gate structure is formed in opening 152 to cover channel regions of the fin structures 102a, in accordance with some embodiments. In some embodiments, the gate structure at least includes a gate dielectric structure and a gate electrode layer. Moreover, the gate dielectric structure includes a first layer and a second layer over the first layer and made of a material that is different from a material of the first layer. FIGS. 1K to 1N, 2A to 2D, and 3A to 3D show the formation of the gate structure.

In some embodiments, a dielectric layer 160 is formed to cover each fin structure 102a in the opening 152 (i.e., each channel feature or the channel region of each fin structure 102a), as shown in FIGS. 1K, 2A, and 3A. As shown in FIG. 2A, each dielectric layer 160 is formed between the corresponding source feature 142a and the corresponding drain feature 142b and in contact with the gate spacer layers 138. As shown in FIG. 3A, the dielectric layer 160 covers portions of the isolation features 120a. Moreover, the dielectric layer 160 is in contact with and conformally formed on the top surface 101 and two opposing sidewall surfaces 103 of each fin structure 102a in the opening 152.

In some embodiments, the dielectric layer 160 is referred to as an interfacial layer (IL) and functions as a portion of the gate dielectric structure. In other words, the dielectric layer 160 serves as the first layer of the gate dielectric structure. The dielectric layer 160 also serves as an adhesion layer between the underlying fin structure 102a and the overlying layer that is subsequently formed. In some embodiments, the dielectric layer 160 is made of oxide and is formed by a proper technique, such as a thermal oxidation process, a UV-Ozone oxidation process, or an atomic layer deposition process. In some other embodiments, the dielectric layer 160 is made of semiconductor oxide, such as silicon oxide or germanium oxide.

Figure 2B:
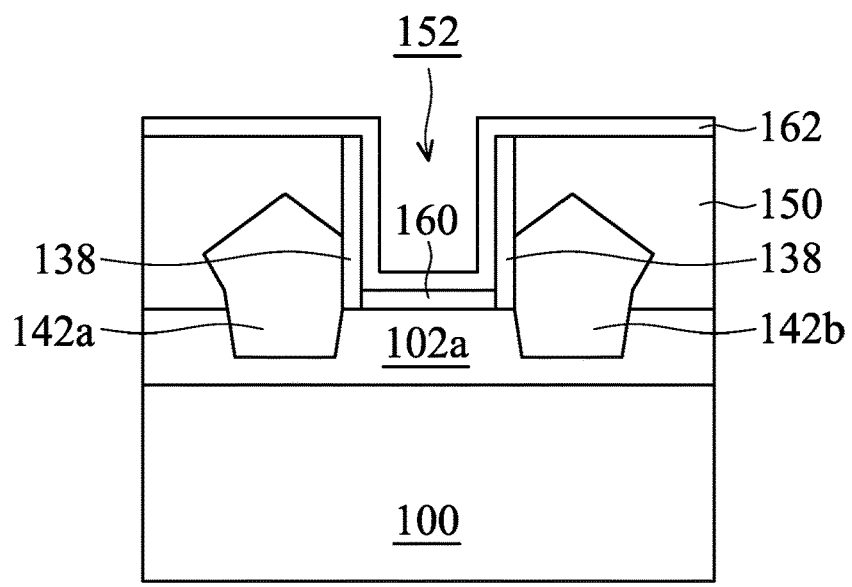
Figure 3B:
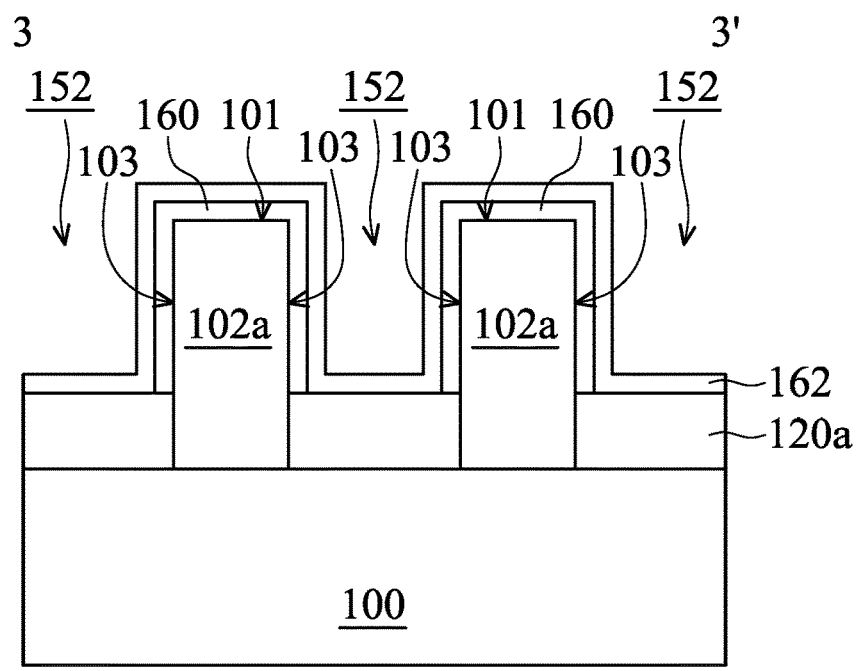

After the dielectric layer 160 is formed, a dielectric layer 162 is conformally formed over the dielectric layer 160, as shown in FIGS. 1L, 2B, and 3B in accordance with some embodiments. As shown in FIG. 2B, the dielectric layer 162 formed over the dielectric layer 160 in the opening 152 is in contact with the gate spacer layers 138 and covers the exposed fin structures 102a between the source features 142a and the drain features 142b. Moreover, the dielectric layer 162 conformally extends over and covers the top surface of the dielectric layer 150. As shown in FIG. 3B, the dielectric layer 162 covers portions of the isolation features 120a. Moreover, the dielectric layer 162 is in contact with the dielectric layer 160 and conformally covers the top surface 101 and two opposing sidewall surfaces 103 of each fin structure 102a in the opening 152.

In some embodiments, the dielectric layer 162 functions as another portion of the gate dielectric structure. In other words, the dielectric layer 162 serves as the second layer of the gate dielectric structure. The dielectric layer 162 is made of a material different from that of the dielectric layer 160. In some embodiments, the dielectric layer 162 is made of a high k dielectric material, such as metal oxide, metal nitride, or metal silicate. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material. In some embodiments, the dielectric layer 162 is formed using a CVD process, a PVD process, an ALD process, or another applicable process.

In some other embodiments, the dielectric layer 162 is made of a negative capacitance material that is different from the negative capacitance material used in the fin structures 102a, and is formed using a CVD process, a PVD process, an ALD process, or another applicable process. In those cases, both of the fin structures 102a in the opening 152 (i.e., the channel features) and the gate dielectric structure including the dielectric layer 162 are capable of providing the negative capacitance effect in the subsequently formed semiconductor device structure (e.g., the negative capacitance FinFET structure), so as to increase device performance.

Moreover, the observed hysteresis direction of the channel features is opposite to the observed hysteresis direction of the gate dielectric structure. Therefore, the hysteresis behavior in the negative capacitance FinFET structure can be mitigated or eliminated.

In addition, when the critical dimension (CD) of the subsequently formed gate structures is small, the thickness (or height) of the fin structure 102a (or the channel feature) can be adjusted or controlled for capacitance matching. As a result, the adjustment or control of the thickness of the gate dielectric structure for capacitance matching becomes flexible. Accordingly, the process window of the subsequent gate-filling can be maintained or increased without affecting the device's performance.

In some embodiments, the dielectric layer 162 is made of a ferroelectric or anti-ferroelectric dielectric material. For example, the negative capacitance material used in the fin structures 102a is a ferroelectric semiconductor material and the dielectric layer 162 is made of a ferroelectric dielectric material. In another example, the negative capacitance material used in the fin structures 102a may be a ferroelectric semiconductor material and the dielectric layer 162 may be made of an anti-ferroelectric dielectric material. In another example, the negative capacitance material used in the fin structures 102a may be an anti-ferroelectric semiconductor material and the dielectric layer 162 may be made of a ferroelectric dielectric material. In another example, the negative capacitance material used in the fin structures 102a may be an anti-ferroelectric semiconductor material and the dielectric layer 162 may be made of an anti-ferroelectric dielectric material.

In some embodiments, the ferroelectric dielectric material includes hafnium oxide doped with silicon, aluminum, zirconium, or lanthanum. In some other embodiments, the ferroelectric dielectric material includes $HfSiO_x$, $HfZrO_x$, $HfAlO_x$, $HfLaO_x$, $BaSrTiO_x$ (BST), $PbZr_xTi_yO_z$ (PZT), or the like. Although some of the ferroelectric dielectric materials (such as $HfSiO_x$ and $HfZrO_x$) include the same elements as some high-k dielectric materials, those ferroelectric dielectric materials have different properties than high-k dielectric materials. For example, the ferroelectric dielectric material may have a lower resistivity than the respective high-k dielectric material that contains the same type of elements. In some embodiments, the anti-ferroelectric dielectric material includes lead zirconate-based material After the gate dielectric structure including the dielectric layers 160 and 162 is formed, a work functional metal layer (not shown) is formed over the gate dielectric structure and conformally covers the inner surface of the opening 152, in accordance with some embodiments. The work function metal layer is tuned to have a proper work function.

In some embodiments, the work function metal layer is made of an N-type work-function metal or a P-type work-function metal. Examples of the N-type work-function metal may include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. Examples of the P-type work-function metal may include titanium nitride (TiN), tungsten nitride (WN), tantalum nitride (TaN), or a combination thereof. The work function metal layer may be formed by an ALD process, a sputtering process, a PVD process, or another applicable process.

In some other embodiments, a conformal capping or barrier layer (not shown) is optionally formed over the gate dielectric structure prior to formation of the work function metal layer, so that the capping or barrier layer is between gate dielectric layer 162 and the work function metal layer. The capping or barrier layer is employed to prevent the metal formed over it from penetrating into the channel region of the fin structure below the metal gate structure.

In some embodiments, the capping or barrier layer is made of metal nitride. Examples of the metal nitride include TiN, TaN, and WN. The capping or barrier layer may be formed by a PVD process, an ALD process, or another applicable process.

Figure 2C:
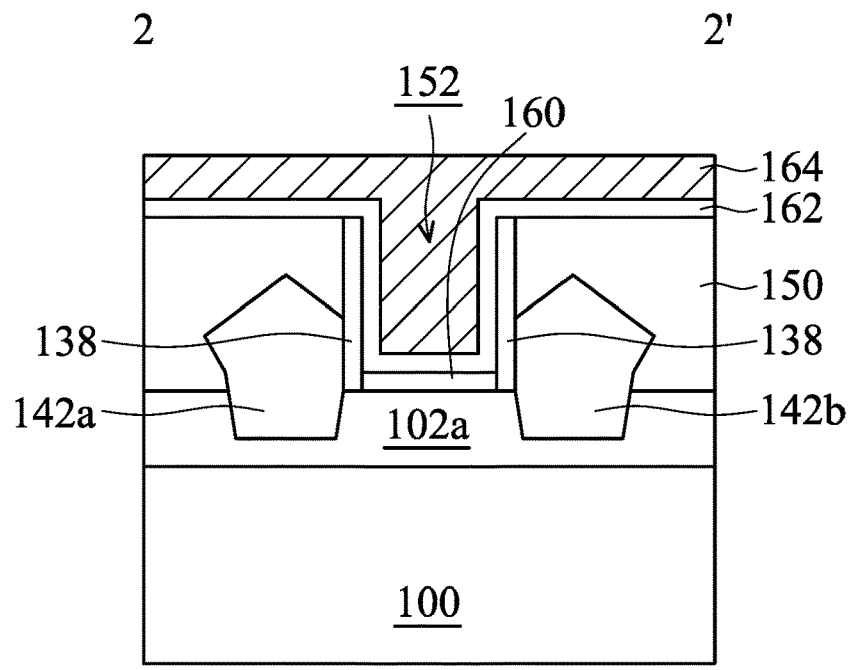
Figure 3C:
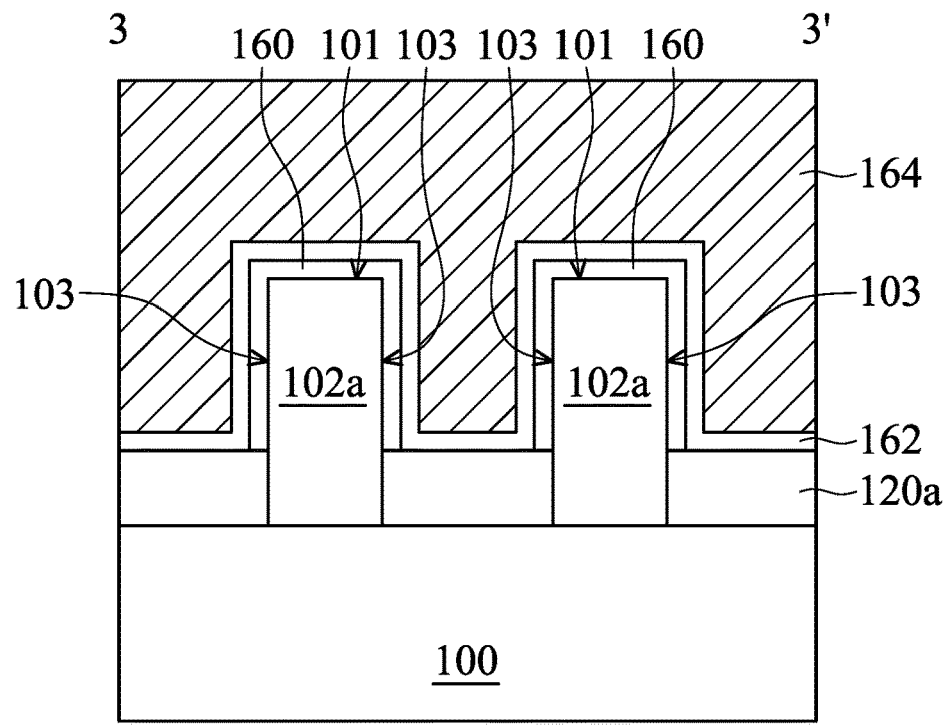

After the work functional metal layer is formed, a gate electrode layer 164 is formed over the dielectric layer 150 to cover the work functional metal layer and fill the opening 152 (as indicted in FIGS. 1L, 2B, and 3B), as shown in FIGS. 1M, 2C, and 3C in accordance with some embodiments. In some embodiments, the gate electrode layer 164 is made of a conductive material, such as copper, tungsten, aluminum, titanium, tantalum, or another applicable material. The gate electrode layer 164 may be formed using a CVD process, a HDPCVD process, a metal organic chemical vapor deposition (MOCVD) process, a PECVD process, or another applicable process.

Figure 2D:
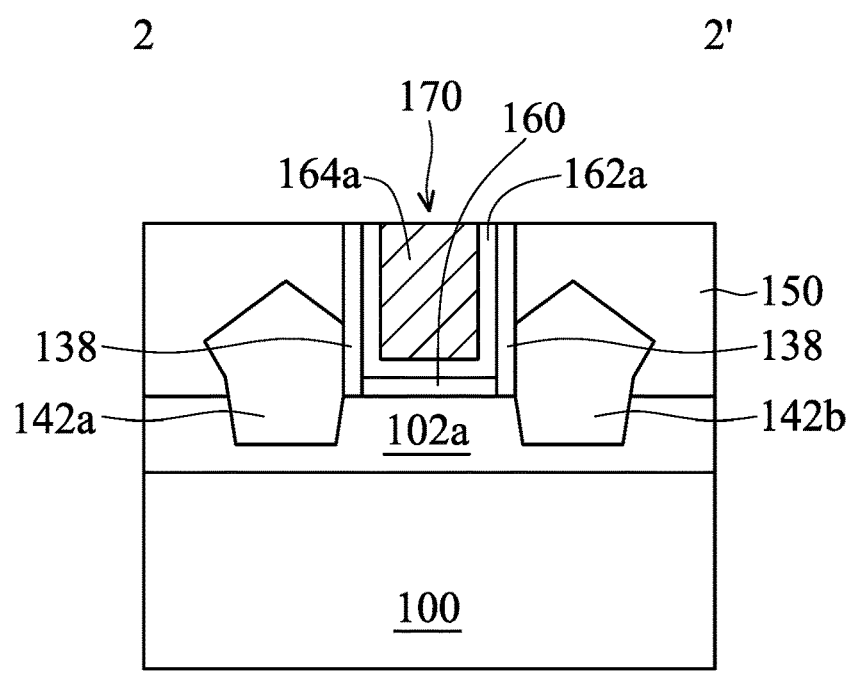
Figure 3D:
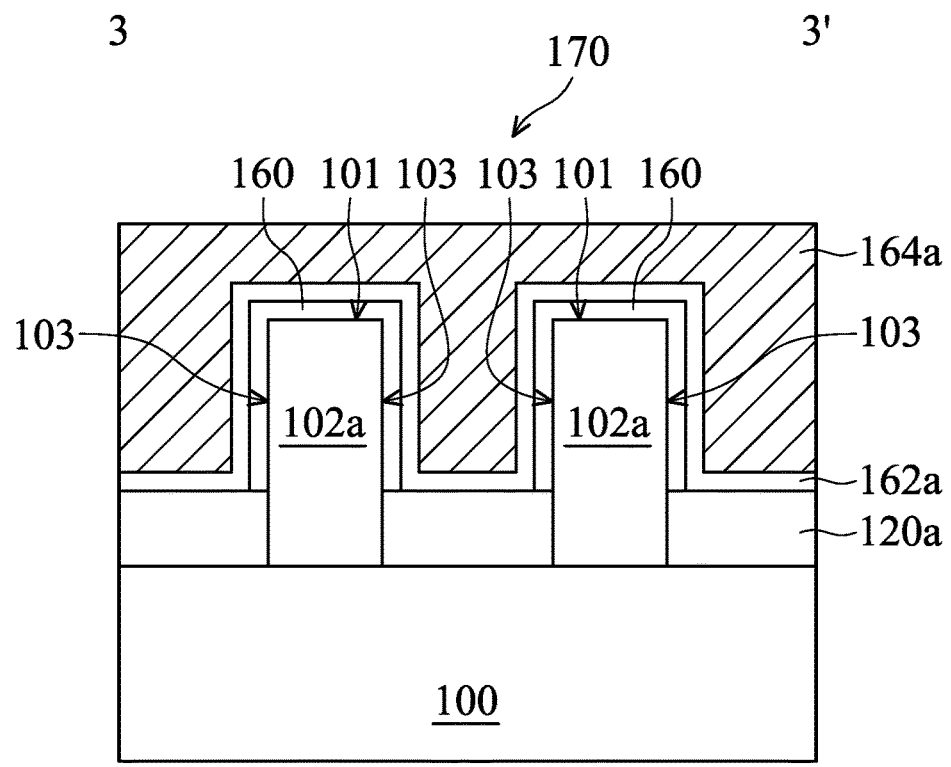

After the gate electrode layer 164 is formed, the gate electrode layer 164, the work function metal layer, the capping or barrier layer, and the dielectric layer 162 over the dielectric layer 150 are successively removed, as shown in FIGS. 1N, 2D, and 3D in accordance with some embodiments. For example, the gate electrode layer 164, the work function metal layer, the capping or barrier layer, and the dielectric layer 162 over the dielectric layer 150 are successively removed by a chemical mechanical polishing (CMP) process to expose a top surface of the dielectric layer 150. As a result, the remaining dielectric layer 162a is formed on opposing sidewall surfaces of the remaining gate electrode layer 164a and between the dielectric layer 160 and the remaining gate electrode layer 164a. The remaining dielectric layer 162a and the dielectric layers 160 in the opening 152 (not shown and as indicated in FIGS. 1L, 2B, and 3B) form a gate dielectric structure of an active gate structure 170. Moreover, the remaining gate electrode layer 164a in the opening 152 serves as the gate electrode of the active gate structure 170.

Although FIGS. 1A to 1N illustrate the formation of a semiconductor device structure with fin structures 102a made of negative capacitance materials, embodiments of the disclosure are not limited thereto. Many variations and/or modifications can be made to embodiments of the disclosure.

Figure 4A:
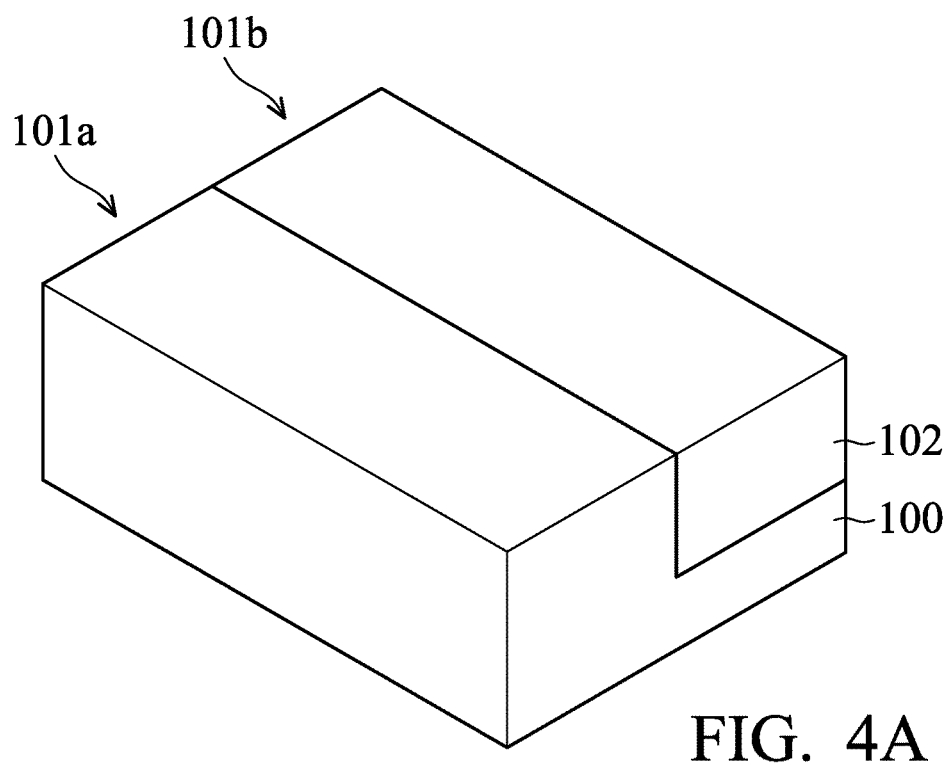
FIGS. 4A to 4C show perspective representations of various stages of forming a semiconductor device structure, in accordance with some embodiments.
Figure 4B:
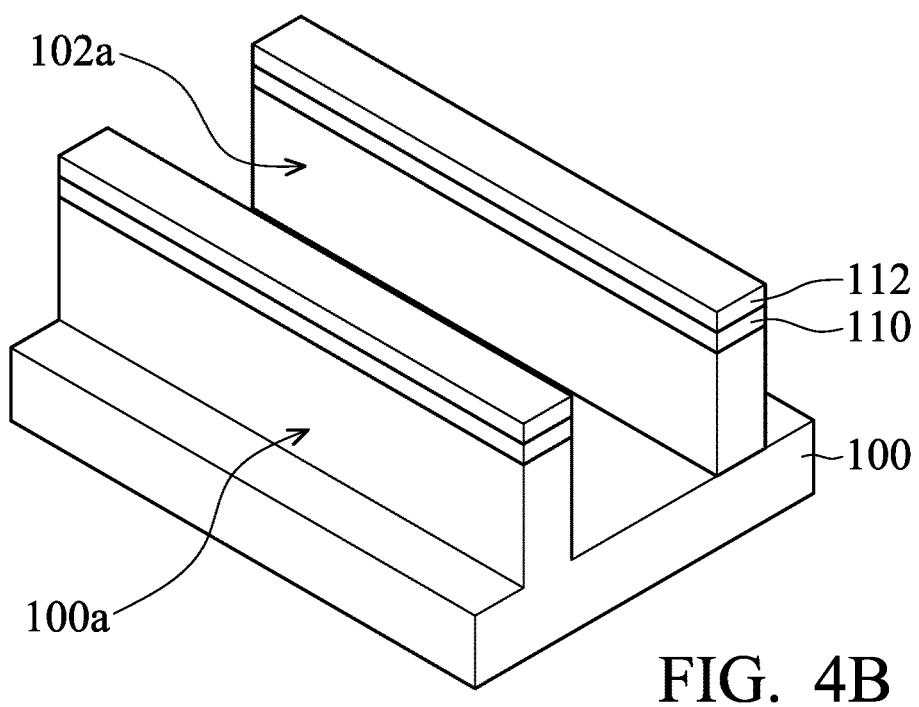
Figure 4C:
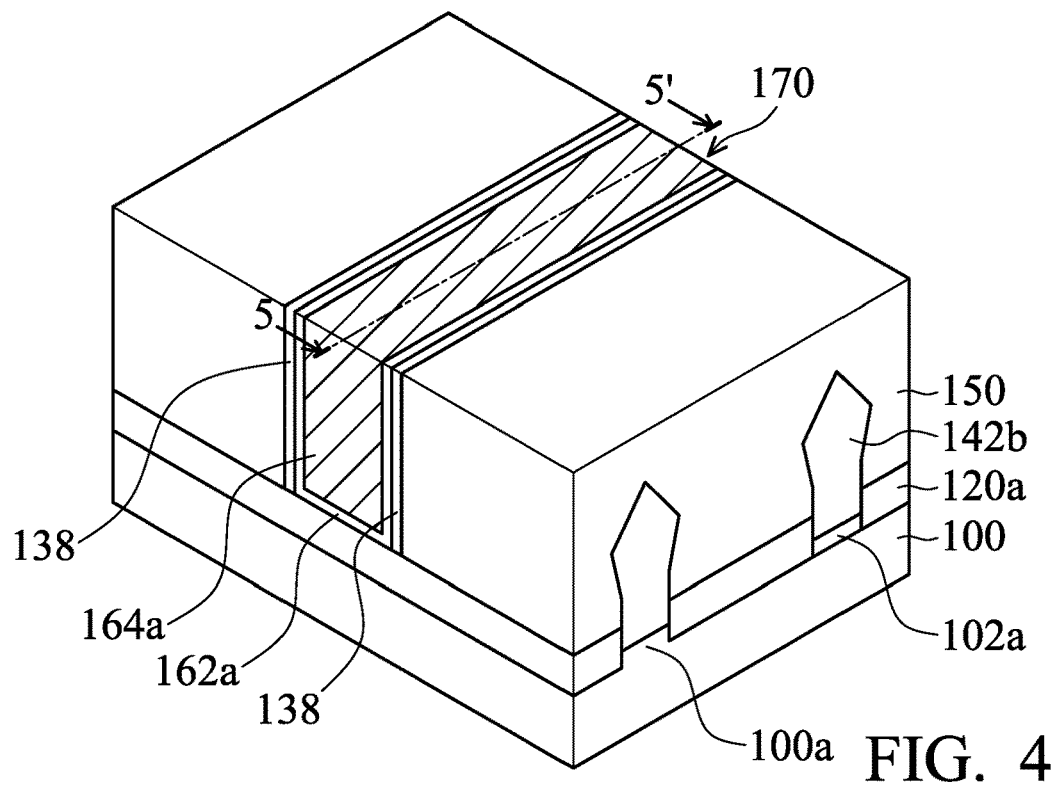
Figure 5:
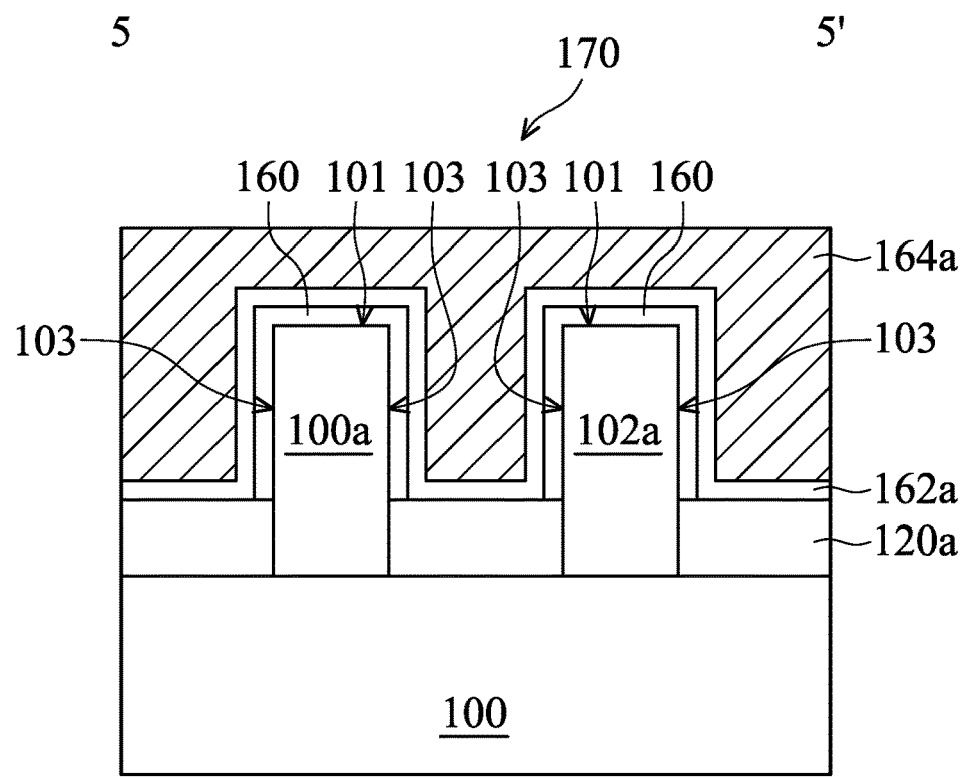
FIG. 5 shows a cross-sectional representation of the semiconductor device structure taken along the line 5-5' in FIG. 4C, in accordance with some embodiments.

FIGS. 4A to 4C illustrate perspective views of various stages of manufacturing a semiconductor device structure in accordance with some embodiments. In addition, FIG. 5 illustrates the cross-sectional representation of the semiconductor device structure shown along line 5-5' in FIG. 4C in accordance with some embodiments.

As shown in FIG. 4A, a substrate 100 having a first region 101a and a second region 101b adjacent to the first region 101a is provided. Afterwards, a portion of the second region 101b of the substrate 100 is removed by a lithography process followed by are etching process (such as a wet etching process or a dry etching process) to form a recess (not shown).

After the recess is formed, a negative capacitance material 102 is formed in the recess over the substrate 100 in accordance with some embodiments. In some embodiments, the formation of the negative capacitance material 102 can use a method that is the same as or similar to the method shown in FIG. 1A. Afterwards, a patterning process is performed on the structure shown in FIG. 4A to form fin structures and trenches in the substrate 100 by using a method that is the same as or similar to the method shown in FIGS. 1B to 1D, in accordance with some embodiments. In order to simplify the diagram, two fin structures 100*a* and 102*a* are formed. The fin structure 100*a* formed by the substrate 100, and the fin structure 102*a* formed by the negative capacitance material 102 are depicted as an example.

As shown in FIG. 4C, after the fin structures 100*a* and 102*a* are formed, gate spacer layers 138, a source feature 142*a* (not shown and as indicated in FIG. 1I) and a drain feature 142*b*, dielectric layer 150, and an active gate structure 170 are successively formed by methods that are the same or similar to the methods shown in FIGS. 1E to 1N, in accordance with some embodiments. The structure shown FIG. 5 is similar to FIG. 3D. In some embodiments, the remaining dielectric layer 162*a* is formed on opposing sidewall surfaces of the remaining gate electrode layer 164*a* and between the dielectric layer 160 and the remaining gate electrode layer 164*a*. The remaining dielectric layer 162*a* and the dielectric layers 160 in the opening 152 (not shown and as indicated in FIGS. 1L, 2B, and 3B) form a gate dielectric structure of an active gate structure 170. Moreover, the remaining gate electrode layer 164*a* in the opening 152 serves as the gate electrode of the active gate structure 170. Unlike the semiconductor device structure shown in FIG. 3D, the semiconductor device structure shown in FIG. 5A includes fin structures 100*a* and 102*a* made of different materials and formed on the same substrate 100, thereby increasing the design flexibility for different circuit demands.

Embodiments of a semiconductor device structure and a method for forming the same are provided. The semiconductor device structure includes a substrate having a fin structure that includes a negative capacitance (NC) material. The formation of the fin structure includes forming a negative capacitance material over a substrate and patterning the negative capacitance material to form the fin structure over the substrate. Afterward, a gate dielectric structure and a gate electrode layer are formed over the fin structure, so that the gate dielectric structure covers the fin structure and the gate electrode layer is formed over gate dielectric structure. The fin structure with the negative capacitance material can provide the negative capacitance effect in the semiconductor device structure, so as to increase device performance. For capacitance matching, the adjustment or control of the thickness of the fin structure having the negative capacitance material is easy and flexible compared to the adjustment or control of the thickness of the gate structure having the negative capacitance material. As a result, when the gate structures with small critical dimension (CD) are formed, the formation of negative capacitance (NC) transistor devices with satisfactory performance can be accomplished without reducing or impacting gate-filling process window. Accordingly, it is advantageous to perform the gate-filling process in the fabrication of semiconductor device.

In some embodiments, a semiconductor device structure is provided. The semiconductor device structure includes a substrate having a fin structure that includes a first negative capacitance material. The semiconductor device structure also includes a gate dielectric structure covering the top surface and opposing sidewall surfaces of the fin structure. The semiconductor device structure also includes a gate electrode layer formed over the gate dielectric structure. The semiconductor device structure also includes a source feature and a drain feature formed in and protruding from the fin structure, and separated from each other by the gate electrode layer.

In some embodiments, a semiconductor device structure is provided. The semiconductor device structure includes a channel feature, a source feature, and a drain feature separated from the source feature by the channel feature. The semiconductor device structure also includes a gate structure between the source feature and the drain feature. The gate structure includes a first dielectric layer formed over the channel feature and an electrode layer formed over the first dielectric layer. The channel feature is a made of a first negative capacitance material and the first dielectric layer is made of a second negative capacitance material that is different from the first negative capacitance material.

In some embodiments, a method for forming a semiconductor device structure is provided. The method includes forming a first negative capacitance material over a substrate and patterning the first negative capacitance material to form a fin structure over the substrate. The method also includes forming a source feature and a drain feature in and protruding from a source region and a drain region of the fin structure. The method also includes forming a gate dielectric structure between the source feature and the drain feature to cover a channel region of the fin structure and forming a gate electrode layer over the gate dielectric structure.

In some embodiments, a method for forming a semiconductor device structure is provided. The method includes forming a fin structure over the substrate, and the fin structure includes a first negative capacitance material. The method also includes forming a gate dielectric layer over the fin structure, and the gate dielectric layer includes a second negative capacitance material. The method includes forming a gate electrode layer over the gate dielectric layer.

In some embodiments, a method for forming a semiconductor device structure is provided. The method includes forming a first fin structure and a second fin structure over a substrate. The first fin structure and the second fin structure are made of different materials, and the second fin structure includes a first negative capacitance material. The method includes forming a gate dielectric layer over the first fin structure and the second fin structure, and forming a gate electrode layer over the gate dielectric layer.

In some embodiments, a semiconductor device structure is provided. The semiconductor device structure includes a substrate having a fin structure that includes a first negative capacitance material, and an isolation structure formed over the substrate. The semiconductor device structure includes a gate structure formed over the fin structure, and a source feature and a drain feature formed over the fin structure. An interface between the fin structure and the source feature is lower than a top surface of the isolation structure.

In some embodiments, a semiconductor device structure is provided. The semiconductor device structure includes a first fin structure extended from a substrate, and a second fin structure formed adjacent to the first fin structure, wherein the second fin structure includes a first negative capacitance material. The semiconductor device structure includes a first source feature formed over the first fin structure, and a second source feature formed over the second fin structure. There is a first interface between the second fin structure and the substrate, and a second interface between the second source feature and the second fin structure.

In some embodiments, a semiconductor device structure is provided. The semiconductor device structure includes a first fin structure extended from a substrate, and a second fin structure formed adjacent to the first fin structure. The second fin structure is made of a first negative capacitance material. The semiconductor device structure includes a gate structure formed across the first fin structure and the second fin structure, and the gate structure includes a gate dielectric layer, and the gate dielectric layer is made of a second negative capacitance material that is different from the first negative capacitance material.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a fin structure that comprises a first negative capacitance material;
   an isolation structure formed over the substrate;
   a gate structure formed over the fin structure; and
   a source feature and a drain feature formed over the fin structure, wherein an interface between the fin structure and the source feature is lower than a top surface of the isolation structure.

2. The semiconductor device structure as claimed in claim 1, wherein the first negative capacitance material is a ferroelectric or anti-ferroelectric semiconductor material.

3. The semiconductor device structure as claimed in claim 1, wherein the gate structure comprises:
   a first layer in direct contact with the fin structure; and
   a second layer formed over the first layer, wherein the second layer is made of a material that is different from a material of the first layer.

4. The semiconductor device structure as claimed in claim 3, further comprising:
   a gate spacer layer formed adjacent to the gate structure, wherein a top surface of the gate spacer layer is higher than a top surface of the first layer.

5. The semiconductor device structure as claimed in claim 3, wherein the second layer comprises a second negative capacitance material that is different from the first negative capacitance material.

6. The semiconductor device structure as claimed in claim 5, wherein the second negative capacitance material is a ferroelectric or anti-ferroelectric semiconductor material.

7. The semiconductor device structure as claimed in claim 5, wherein the first negative capacitance material is a ferroelectric semiconductor material and the second negative capacitance material is an anti-ferroelectric dielectric material.

8. A semiconductor device structure, comprising:
   a first fin structure extended from a substrate;
   a second fin structure formed adjacent to the first fin structure, wherein the second fin structure comprises a first negative capacitance material;
   a first source feature formed over the first fin structure; and
   a second source feature formed over the second fin structure, wherein there is a first interface between the second fin structure and the substrate, and a second interface between the second source feature and the second fin structure.

9. The semiconductor device structure as claimed in claim 8, wherein the first negative capacitance material is a ferroelectric or anti-ferroelectric semiconductor material.

10. The semiconductor device structure as claimed in claim 8, further comprising:
    an isolation structure formed over the substrate, wherein the second interface is lower than a top surface of the isolation structure.

11. The semiconductor device structure as claimed in claim 10, wherein the first interface is substantially coplanar with a bottom surface of the isolation structure.

12. The semiconductor device structure as claimed in claim 8, further comprising:
    a gate dielectric layer formed over the second fin structure, wherein the gate dielectric layer comprises a second negative capacitance material that is different from the first negative capacitance material.

13. The semiconductor device structure as claimed in claim 12, wherein the second negative capacitance material is a ferroelectric or anti-ferroelectric semiconductor material.

14. A semiconductor device structure, comprising:
    a first fin structure extended from a substrate;
    a second fin structure formed adjacent to the first fin structure, wherein the second fin structure is made of a first negative capacitance material; and
    a gate structure formed across the first fin structure and the second fin structure, wherein the gate structure comprises a gate dielectric layer, and the gate dielectric layer is made of a second negative capacitance material that is different from the first negative capacitance material.

15. The semiconductor device structure as claimed in claim 14, wherein the first negative capacitance material is a ferroelectric semiconductor material and the second negative capacitance material is a ferroelectric dielectric material.

16. The semiconductor device structure as claimed in claim 14, wherein the first negative capacitance material is a ferroelectric semiconductor material and the second negative capacitance material is an anti-ferroelectric dielectric material.

17. The semiconductor device structure as claimed in claim 14, wherein the first negative capacitance material is an anti-ferroelectric semiconductor material and the second negative capacitance material is a ferroelectric dielectric material.

18. The semiconductor device structure as claimed in claim 14, wherein the first negative capacitance material is an anti-ferroelectric semiconductor material and the second negative capacitance material is an anti-ferroelectric dielectric material.

19. The semiconductor device structure as claimed in claim 14, wherein the gate structure further comprises an interfacial layer, and the interfacial layer is in direct contact with the first fin structure and the second fin structure.

20. The semiconductor device structure as claimed in claim 19, further comprising:
   a gate spacer layer formed adjacent to the gate structure, wherein a top surface of the gate spacer layer is higher than a top surface of the interfacial layer.

* * * * *